United States Patent
Breen et al.

(10) Patent No.: US 9,263,710 B2
(45) Date of Patent: Feb. 16, 2016

(54) METHOD FOR PREPARING SEMICONDUCTOR NANOCRYSTALS

(71) Applicant: QD VISION, INC., Lexington, MA (US)

(72) Inventors: Craig A. Breen, Somerville, MA (US); Mayank Puri, Minneapolis, MN (US)

(73) Assignee: QD VISION, INC., Lexington, MA (US)

( * ) Notice: Subject to any disclaimer, the term of this patent is extended or adjusted under 35 U.S.C. 154(b) by 0 days.

(21) Appl. No.: 14/461,070

(22) Filed: Aug. 15, 2014

(65) Prior Publication Data

US 2015/0044806 A1 Feb. 12, 2015

Related U.S. Application Data

(63) Continuation of application No. PCT/US2013/026430, filed on Feb. 15, 2013.

(60) Provisional application No. 61/599,781, filed on Feb. 16, 2012.

(51) Int. Cl.
*H01L 21/02* (2006.01)
*B82Y 40/00* (2011.01)
*H01L 51/56* (2006.01)

(52) U.S. Cl.
CPC .......... *H01L 51/56* (2013.01); *H01L 21/02469* (2013.01); *H01L 21/02513* (2013.01); *H01L 21/02551* (2013.01); *H01L 21/02601* (2013.01); *H01L 21/02628* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 6,322,901 B1 | 11/2001 | Bawendi et al. | |
| 6,903,505 B2 | 6/2005 | McNulty et al. | |
| 7,253,452 B2 * | 8/2007 | Steckel et al. | 257/103 |
| 7,981,667 B2 * | 7/2011 | Nie et al. | 435/288.7 |
| 8,337,721 B2 | 12/2012 | Bowers et al. | |
| 8,354,785 B2 | 1/2013 | Clough et al. | |
| 8,718,437 B2 | 5/2014 | Coe-Sullivan et al. | |
| 8,845,927 B2 | 9/2014 | Breen et al. | |
| 2002/0144644 A1 | 10/2002 | Zehnder et al. | |
| 2003/0003300 A1 | 1/2003 | Korgel et al. | |
| 2005/0129947 A1 | 6/2005 | Peng et al. | |
| 2006/0057382 A1 * | 3/2006 | Treadway et al. | 428/403 |
| 2006/0169971 A1 | 8/2006 | Cho et al. | |
| 2007/0012355 A1 | 1/2007 | LoCascio et al. | |
| 2007/0034833 A1 | 2/2007 | Parce et al. | |
| 2007/0063154 A1 | 3/2007 | Chen et al. | |
| 2009/0226371 A1 * | 9/2009 | Laarmann et al. | 424/9.1 |
| 2009/0296368 A1 | 12/2009 | Ramer | |
| 2010/0252778 A1 | 10/2010 | Murase et al. | |
| 2010/0314646 A1 | 12/2010 | Breen et al. | |
| 2011/0006285 A1 * | 1/2011 | Lifshitz et al. | 257/15 |
| 2011/0049442 A1 | 3/2011 | Schreuder et al. | |
| 2011/0103064 A1 | 5/2011 | Coe-Sullivan et al. | |
| 2011/0186811 A1 | 8/2011 | Coe-Sullivan et al. | |
| 2011/0223425 A1 | 9/2011 | Schreuder et al. | |
| 2011/0262752 A1 | 10/2011 | Bawendi et al. | |
| 2012/0113671 A1 | 5/2012 | Sadasivan et al. | |
| 2012/0187367 A1 | 7/2012 | Modi et al. | |
| 2012/0189791 A1 | 7/2012 | Modi et al. | |
| 2014/0140918 A1 | 5/2014 | Breen et al. | |

FOREIGN PATENT DOCUMENTS

| | | |
|---|---|---|
| WO | WO2008133660 A2 | 11/2008 |
| WO | WO2009035657 A1 | 3/2009 |
| WO | WO2009137053 A1 | 11/2009 |
| WO | WO2009151515 A1 | 12/2009 |
| WO | WO2010123350 A2 | 11/2010 |
| WO | WO2010129374 A2 | 11/2010 |
| WO | WO2012021643 A2 | 2/2012 |
| WO | WO2012158832 A2 | 11/2012 |
| WO | WO2013123390 A1 | 8/2013 |

OTHER PUBLICATIONS

Bagga, et al., "Origin of Stokes shifts in InAs and CdSe quantum dots: Exchange splitting of excitonic states", *Phys. Rev. B* (2006), vol. 74, 035341 (7 pgs.).

Dabbousi, et al., "(CdSe) ZnS Core-Shell Quantum Dots: Synthesis and Characterization of a Size Series of Highly Luminescent Nanocrystallites", *J. Phys. Chem.* 101, 9463, 1997.

Fei, et al., "Synthesis and Stokes Shift of Water-Soluble CdTe/CDS Core-Shell Structure Quantum Dots", *Chalcogenide Letters* (2010), vol. 7, No. 1, pp. 83-87.

Joshi, et al., "Temperature dependence of the band gap of colloidal CdSe/ZnS core/shell nanocrystals embedded into an ultraviolet curable resin", *Appl. Phys. Lett.* (2006), vol. 89, 131907 (3 pgs).

Kim, et al., "Synthesis and Characterization of Co/CdSe Core/Shell Nanocomposites: Bifunctional Magnetic-Optical Nanocrystals", *J. Am. Chem. Soc.* (2005), vol. 127, pp. 544-546.

Murray, C.B., et al., "Synthesis and Characterization of Monodisperse Nanocrystals and Close-Packed Nanocrystal Assemblies", *Annu. Rev. Mater. Sci.*, 2000, 30: pp. 545-610.

(Continued)

*Primary Examiner* — Scott B Geyer

(57) ABSTRACT

A method for preparing semiconductor nanocrystals including a core and an overcoating layer is disclosed. According to one aspect of the invention, the method comprises preparing more than one batch of cores comprising a first semiconductor material and having a maximum emission peak within a predetermined spectral region, wherein each batch of cores is characterized by a first excitonic absorption peak at an absorption wavelength and a maximum emission peak at an emission wavelength; selecting a batch of cores from the batches prepared wherein the selected batch is characterized by a difference between the absorption wavelength and the emission wavelength that is less than or equal to 13; and overcoating the cores of the selected batch with a layer comprising a second semiconductor material.

20 Claims, No Drawings

(56) References Cited

OTHER PUBLICATIONS

Murray, C., et al., "Synthesis and Characterization of Nearly Monodisperse CdE (E = S, Se, Te) Semiconductor Nanocrystallites" (Nov. 1993), *J. Am. Chem. Soc.*, 115, pp. 8706-8715.

PCT Search Report and Written Opinion mailed Jun. 3, 2013, for PCT/US2013/026430 which is the parent of this case.

Pradhan, et al., "Efficient and Color-Tunable Mn-Doped ZnSe Nanocrystal Emitters: Control of Optical Performance via Greener Synthetic Chemistry", *J. Am. Chem. Soc.* (2007), vol. 129 (11), pp. 3339-3347.

Pradhan, et al., Supporting Information for J. Am. Chem. Soc. (2007), vol. 129 (11), pp. 3339-3347: "Efficient and Color-Tunable Mn-Doped ZnSe Nanocrystal Emitters: Control of Optical Performance via Greener Synthetic Chemistry", pp. S1-S7.

Rogach, et al., "Aqueous Synthesis of Thiol-Capped CdTe Nanocrystals: State-of-the-Art", *J. Phys. Chem. C* (2007), vol. 111 (40), pp. 14628-14637.

Wang, X-Y, et al., "Electronic structure transformation from a quantum-dot to a quantum-wire system: Photoluminescence decay and polarization of colloidal CdSe quantum rods", *Appl. Phys. Lett.* (2002), vol. 81, 4829 (3 pgs.).

Zhong, et al., "High-Quality Violet- to Red-Emitting ZnSe/CdSe Core/Shell Nanocrystals", *Chem. Mater.* (2005), vol. 17, pp. 4038-4042.

Zhong, et al., Supporting Information for: "High-Quality Violet- to Red-Emitting ZnSe/CdSe Core/Shell Nanocrystals", *Chem. Mater.* (2005), vol. 17, pp. 4038-4042.

\* cited by examiner

METHOD FOR PREPARING SEMICONDUCTOR NANOCRYSTALS

This application is a continuation of International Application No. PCT/US2013/026430, filed 15 Feb. 2013, which was published in the English language as International Publication No. WO 2013/123390 on 22 Aug. 2013, which International Application claims priority to U.S. Provisional Patent Application No. 61/599,781, filed on 16 Feb. 2012. Each of the foregoing is hereby incorporated herein by reference in its entirety for all purposes.

FEDERALLY SPONSORED RESEARCH OR DEVELOPMENT

This invention was made with Government support under Contract No. 2004*H838109*000 awarded by the Central Intelligence Agency. The Government has certain rights in the invention.

TECHNICAL FIELD OF THE INVENTION

The present invention relates to the technical field of nanotechnology, and more particularly to semiconductor nanocrystals and methods for making same.

BACKGROUND OF THE INVENTION

Semiconductor nanocrystals are useful in various lighting, display, photodetection, solar, biological, taggant, and other end-use applications. It would represent an advance in the art to provide an improved method for preparing semiconductor nanocrystals including a core and an overcoating layer.

SUMMARY OF THE INVENTION

In accordance with one aspect the present invention, there is provided a method for preparing semiconductor nanocrystals including a core and an overcoating layer. The method comprises preparing more than one batch of cores comprising a first semiconductor material and having a maximum emission peak within a predetermined spectral region, wherein each batch of cores is characterized by a first excitonic absorption peak at an absorption wavelength and a maximum emission peak at an emission wavelength; selecting a batch of cores from the batches prepared wherein the selected batch is characterized by a difference between the absorption wavelength and the emission wavelength that is less than or equal to 13 nm; and overcoating the cores of the selected batch with a layer comprising a second semiconductor material.

Preferably the layer is coated over the cores to a predetermined thickness.

The difference between the first excitonic absorption peak wavelength and maximum emission peak wavelength is typically expressed in nanometers (nm) and is also referred to as "Stokes shift".

The selected batch of cores can preferably further be characterized by a maximum emission peak having a full-width at half-maximum (FWHM) no greater than 30 nm.

If more than one batch of cores has a difference between the absorption wavelength and the emission wavelength that is less than or equal to 13 nm, such batches can optionally be combined for overcoating. The emission wavelength for each of the combined batches preferably differs from that of any combined batch by no more than 5 nm.

In accordance with another aspect of the present invention, there is provided a method for preparing semiconductor nanocrystals including a core and an overcoating layer comprising the steps of; (a) preparing more than one batch of cores comprising a first semiconductor material and having a maximum emission peak within a predetermined spectral region, wherein each batch of cores is characterized by a first excitonic absorption peak at an absorption wavelength and a maximum emission peak at an emission wavelength; (b) analyzing the batches of cores prepared in step (a) to determine the difference between the absorption wavelength and the emission wavelength for each batch; (c) selecting one or more batches of cores from step (b) wherein the difference is less than or equal to 13 nm; and (d) overcoating the selected batch or batches of cores from step (c) with a layer comprising a second semiconductor material.

Preferably the layer is coated over the cores to a predetermined thickness.

The selected batch of cores can preferably further be characterized by a maximum emission peak having a full-width at half-maximum (FWHM) no greater than 30 nm.

If more than one batch of cores has a difference between the absorption wavelength and the emission wavelength that is less than or equal to 13 nm, such batches can optionally be combined for overcoating. The emission wavelength for each of the combined batches preferably differs from that of any combined batch by no more than 5 nm.

Semiconductor nanocrystals including a core and an overcoating layer prepared by a method in accordance with the present invention is also provided.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

DETAILED DESCRIPTION OF THE INVENTION

Various aspects and embodiments of the present inventions will be further described in the following detailed description.

The present invention relates to semiconductor nanocrystals and methods for preparing semiconductor nanocrystals including a core and an overcoating layer.

Semiconductor nanocrystals are nanometer sized semiconductor particles that can have optical properties arising from quantum confinement. (Semiconductor nanocrystals may also be referred to herein as "quantum dots" or "quantum confined semiconductor nanoparticles".)

Semiconductor nanocrystals can have an average particle size in a range from about 1 to about 1000 nanometers (nm), and preferably in a range from about 1 to about 100 nm. In certain embodiments, semiconductor nanocrystals have an average particle size in a range from about 1 to about 20 nm (e.g., such as about 2, 3, 4, 5, 6, 7, 8, 9, 10, 11, 12, 13, 14, 15, 16, 17, 18, 19, or 20 nm). In certain embodiments, semiconductor nanocrystals have an average particle size in a range from about 1 nm to about 20 nm or about 1 nm to about 10 nm. Semiconductor nanocrystals can have an average diameter less than about 150 Angstroms (Å). In certain embodiments, semiconductor nanocrystals having an average diameter in a range from about 12 to about 150 Å can be particularly desirable. However, depending upon the composition, structure, and desired emission wavelength of the semiconductor nanocrystal, the average diameter may be outside of these ranges.

The particular composition(s), structure, and/or size of a semiconductor nanocrystal can be selected to achieve the desired wavelength of light to be emitted from the semiconductor nanocrystal upon stimulation with a particular excitation source. In essence, semiconductor nanocrystals may be tuned to emit light across the visible spectrum by changing their size. See C. B. Murray, C. R. Kagan, and M. G. Bawendi, *Annual Review of Material Sci.*, 2000, 30: 545-610 hereby incorporated by reference in its entirety.

The narrow FWHM of semiconductor nanocrystals can result in saturated color emission. In certain embodiments, FWHM can be, for example, less than 60 nm, less than 50 nm, less than 40, less than 30 nm, less than 20 nm. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths.

The methods of the present invention relate to preparation of semiconductor nanocrystals including a core and an overcoating layer (also referred to herein as a "shell"). An overcoating layer is disposed over at least a portion, and preferably all, of the outer surface of the core. A semiconductor nanocrystal including a core and overcoating layer is also referred to as a "core/shell" structure.

In a core/shell semiconductor nanocrystal, the shell or overcoating layer may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

A semiconductor nanocrystal core preferably comprises one or more inorganic semiconductor materials. An overcoating layer preferably comprises one or more inorganic semiconductor materials. Examples of semiconductor materials for inclusion in a semiconductor nanocrystal core and in an overcoating layer are provided elsewhere herein.

From a study of core/shell semiconductor nanocrystals prepared from different cores, it was found that core/shell semiconductor nanocrystals prepared from semiconductor nanocrystal cores having a Stokes shift less than or equal to 13 nm demonstrated improved performance (e.g., improved solution quantum yields) compared to core/shell semiconductor nanocrystals prepared from semiconductor nanocrystal cores having a Stokes shift greater than 13 nm.

A summary of such results are provided in the following Table 1.

TABLE 1

| Sample No. | CdSe Core Stokes Shift/FWHM | Ligand/ Monolayers* of CdZnS in Overcoating | Solution Quantum Yield | Core/Shell Emission Wavelength/ FWHM |
|---|---|---|---|---|
| 1 | 12 nm/25 nm | BHT/9 | 80% | 588 nm/30 nm |
| 2 | 18 nm/32 nm | BHT/8 | 59% | 582 nm/37 nm |
| 3 | 14 nm/29 nm | BHT/6 | 66% | 579 nm/30 nm |
| 4 | 15 nm/27 nm | BHT/9 | 65% | 588 nm/30 nm |
| 5 | 13 nm/27 nm | BHT/7.5 | 80% | 592 nm/29 nm |
| 6 | 13 nm/27 nm | BHT/8.5 | 83% | 588 nm/28 nm |
| 7 | 12 nm/27 nm | BHT/7.5 | 88% | 588 nm/28 nm |
| 8 | 12 nm/27 nm | BHT/8.5 | 95% | 588 nm/27 nm |
| 9 | 13 nm/27 nm | BHT/7.5 | 84% | 579 nm/28 nm |
| 10 | 13 nm/27 nm | BHT/7.5 | 91% | 582 nm/28 nm |
| 11 | 12 nm/27 nm | BHT/7.5 | 92% | 584 nm/31 nm |

*The number of monolayers of CdZnS listed in Table 1 is a calculated value based on the estimated amount of cores being overcoated (based on size and total amount/concentration of the semiconductor nanocrystal cores), and the amount of overcoating precursors added to the reaction vessel during the overcoating process.

In the Table, "BHT" refers to 3,5-di-tert-butyl-4-hydroxybenzylphosphonic acid ligand.

The semiconductor nanocrystal cores and core/shell semiconductor nanocrystals for the Samples listed in Table 1 were prepared generally in accordance with the preparation procedures for preparing a CdSe core and a CdZnS overcoating described in the following Example. Variations from the core preparation procedure for "Synthesis of CdSe Cores" of the following Example A for preparing the Samples of Table 1 are summarized in Table 2 below (by Sample No.).

Example

Preparation of Semiconductor Nanocrystals Capable of Emitting 588 nm Light with 3,5-di-tert-butyl-4-hydroxybenzylphosphonic acid A. Synthesis of CdSe Cores:

4 mmol cadmium acetate is dissolved in 38 mmol of tri-n-octylphosphine at 140° C. in a 20 mL vial and then dried and degassed for one hour. 31.0 mmol of trioctylphosphine oxide and 4 mmol of octadecylphosphonic acid are added to a 3-neck flask and dried and degassed at 110° C. for one hour. After degassing, the Cd solution is added to the oxide/acid flask and the mixture is heated to 270° C. under nitrogen. Once the temperature reaches 270° C., 16 mmol of tri-n-butylphosphine is injected into the flask. The temperature is brought back to 270° C. where 2.35 mL of 1.5 M TBP-Se is then rapidly injected. The reaction mixture is heated at 270° C. for 30 seconds and then the heating mantle is removed from the reaction flask allowing the solution to cool to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials.

TABLE 2

Summary of Variations in the above Core Preparation Procedure for Preparation of Samples Listed in Table 1

| Sample No. | Core Pot Scale Of Reaction | TBP Injection (mL) | TBP-Se Injection (mL) | Reaction Time (seconds) | Additional Cooling Steps | First Absorption Peak (nm) | Core Emission Peak (nm) | Stokes Shift (nm) |
|---|---|---|---|---|---|---|---|---|
| 1 | 1x | 4 | 2.35 | 30 | None | 485 | 497 | 12 |
| 2 | 15x | 60 | 34 | 20 | Air gun | 506 | 524 | 18 |
| 3 | 2x | 8 | 4.4 | 15 | Air gun | 513 | 527 | 14 |
| 4 | 2x | 8 | 4.4 | 0 | None | 514 | 529 | 15 |
| 5 | 1x | 4 | 2.2 | 60 | Liquid Nitrogen | 525 | 538 | 13 |
| 6 | 1x | 4 | 2.2 | 30 | Air gun | 518 | 531 | 13 |
| 7 | 1x | 4 | 2.2 | 60 | Air gun | 524 | 536 | 12 |
| 8 | 1x | 4 | 2.2 | 60 | Air gun | 524 | 536 | 12 |
| 9 | 1x | 4 | 2.2 | 45 | Air gun | 524 | 537 | 13 |
| 10 | 1x | 4 | 2.2 | 45 | Air gun | 524 | 537 | 13 |
| 11 | 1x | 4 | 2.2 | 60 | Air gun | 524 | 536 | 12 |

In Table 2, the column entitled "Additional Cooling Steps" identifies any steps taken to cool the reaction vessel in addition to dropping the heating mantle from beneath the reaction vessel (while continuing to stir the mixture in the vessel). "Air gun" refers to blowing unheated air onto the reaction vessel from a heat gun with the heater turned off to speed cooling. "Liquid nitrogen" refers to splashing liquid nitrogen onto the reaction vessel to speed cooling. Regarding the Core Pot Scale of Reaction data listed in Table 2, the listed multipliers are applied to the amounts listed in the above "Synthesis of CdSe Cores" preparation procedure for the "cadmium acetate", "tri-n-octylphosphine", "trioctylphosphine oxide", and "octadecylphosphonic acid". All the other reagents for the respective Samples were used in the amounts listed in Table 2.

B. Synthesis of CdSe/CdZnS Core-Shell Nanocrystals:

A reaction is set up whereby 25.86 mmol of trioctylphosphine oxide and 2.4 mmol of 3,5-di-tert-butyl-4-hydroxybenzylphosphonic acid are loaded into a 50 mL four-neck round bottom flask. The mixture is then dried and degassed in the reaction vessel by heating to 120° C. for about an hour. The flask is then cooled to 70° C. and the hexane solution containing isolated CdSe cores is added to the reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S was in two-fold excess relative to the Cd and Zn. Cd/Zn (0.31 mmol of dimethylcadmium and diethylzinc) and S (1.24 mmol of hexamethyldisilathiane) samples are each dissolved in 4 mL of trioctylphosphine inside a nitrogen atmosphere glove box. Once the precursor solutions are prepared, the reaction flask is heated to 155° C. under nitrogen. The Cd/Zn and S precursor solutions are added dropwise to the reaction flask over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dispersed in toluene.

As shown by the above data, core/shell semiconductor nanocrystals with high quantum yields and narrower FWHM (e.g., 30 nm or less) correspond to cores with a narrower Stokes shift (13 nm or less), while the core/shell material with lower quantum yields and broader FWHM correspond to cores with broader Stokes shifts (greater than 13 nm).

In accordance with one aspect the present invention, there is provided a method for preparing semiconductor nanocrystals including a core and an overcoating layer. The method comprises preparing more than one batch of cores comprising a first semiconductor material and having a maximum emission peak within a predetermined spectral region, wherein each batch of cores is characterized by a first excitonic absorption peak at an absorption wavelength and a maximum emission peak at an emission wavelength; selecting a batch of cores from the batches prepared wherein the selected batch is characterized by a difference between the absorption wavelength and the emission wavelength that is less than or equal to 13; and overcoating the cores of the selected batch with a layer comprising a second semiconductor material.

Preferably the layer is coated over the cores to a predetermined thickness.

In accordance with another aspect of the present invention, there is provided a method for preparing semiconductor nanocrystals including a core and an overcoating layer comprising the steps of: (a) preparing more than one batch of cores comprising a first semiconductor material and having a maximum emission peak within a predetermined spectral region, wherein each batch of cores is characterized by a first excitonic absorption peak at an absorption wavelength and a maximum emission peak at an emission wavelength; (b) analyzing the batches of cores prepared in step (a) to determine the difference between the absorption wavelength and the emission wavelength for each batch; (c) selecting one or more batches of cores from step (b) wherein the difference is less than or equal to 13 nm; and (d) overcoating the selected batch or batches of cores from step (c) with a layer comprising a second semiconductor material.

Preferably the layer is coated over the cores to a predetermined thickness.

In various aspects and embodiments of the methods described herein, the selection of the cores to be overcoated based on the Stokes shift rather than on the first excitonic absorption peak wavelength or maximum emission peak wavelength of the cores, alone, can improve the ability to more consistently achieve one or more of the desired performance attributes of the core/shell prepared.

Such improvement can facilitate improved quality control for production scale preparation of core/shell semiconductor nanocrystals.

In various aspects and embodiments of the present invention described herein, as mentioned above, two or more selected batches can be combined for overcoating.

When two or more selected batches are combined for overcoating, the maximum emission peak wavelength for each of the selected batches preferably differs from that of any other selected batch by no more than 5 nm.

In various aspects and embodiments of the present invention described herein, a selected batch of cores is further preferably characterized by a maximum peak having a full-width at half-maximum no greater than 30 nm, e.g., less than 25 nm, less than 20 nm.

In various aspects and embodiments of the present invention described herein, the first semiconductor material comprises a Group II-VI semiconductor. Such semiconductor can be a binary, ternary, or quaternary material. In certain embodiments, cadmium selenide can be preferred.

In various aspects and embodiments of the present invention described herein, the first semiconductor material comprises a Group III-V semiconductor. Such semiconductor can be a binary, ternary, or quaternary material.

In various aspects and embodiments of the present invention described herein, the second semiconductor material comprises a Group II-VI semiconductor. Such semiconductor can be a binary, ternary, or quaternary material. In certain embodiments, cadmium zinc sulfide can be preferred.

In various aspects and embodiments of the present invention described herein, the second semiconductor material comprises a Group III-V semiconductor. Such semiconductor can be a binary, ternary, or quaternary material.

In various aspects and embodiments of the present invention described herein, the overcoated cores include a ligand.

In various aspects and embodiments of the present invention described herein, a ligand comprises a phosphonic acid-based compound. Examples of such ligands include, but are not limited to, octadecylphosphonic acid, octadecylphosphonic acid including at least one substituent group on at least one or the octadecyl groups, a conjugate base of one of the foregoing acid, or a mixture including one or more of the foregoing; benzylphosphonic acid, benzylphosphonic acid including at least one substituent group on the ring of the benzyl group, a conjugate base of one of the foregoing acid, or a mixture including one or more of the foregoing; and 3,5-di-tert-butyl-4-hydroxybenzylphosphonic acid, a conjugate base of the acid, or a mixture including one or more of the foregoing.

In various aspects and embodiments of the present invention described herein, a ligand comprises an amine-based ligand. Examples of such ligands include, but are not limited to, alkyl amines (wherein one or more of the alkyl groups can optionally include at least one substituent group). In certain embodiments, decylamine can be preferred.

In various aspects and embodiments of the present invention described herein, on overcoated core includes two or more different ligands, such as, for example, but without limitation, a phosphonic acid based ligand and an alkyl amine ligand (e.g., but not limited to, octadecylphosphonic acid and decylamine).

Other ligands can be used. Selection of other ligands is within the skill of the person of ordinary skill in the art.

The methods described herein include preparing more than one batch of semiconductor nanocrystal cores. Such cores can preferably have a predetermined composition and maximum emission peak wavelength at a predetermined wavelength or in a predetermined range of wavelengths (e.g., preferably within 3 nm of the desired predetermined wavelength). An acceptable tolerance for variation in the wavelength of the maximum emission peak wavelength will be influenced by the particular end-use application for which the nanocrystals are intended.

Methods of preparing semiconductor nanocrystal cores are known. One example of a preferred method of preparing a semiconductor nanocrystal core is a colloidal growth process wherein the core can be formed from core precursor materials. For example, semiconductor nanocrystal cores comprising a semiconductor material that can be represented by the formula MX, wherein, for example, M represents one or more metals and X represents one or more chalcogens and/or one or more pnictogens, can be formed from precursors comprising one or more M donors and one or more X donors. Colloidal growth occurs by injection one or more M donors and one or more X donors (the donors being selected based upon the desired composition of the core) into a hot coordinating solvent. One example of a preferred method for preparing monodisperse semiconductor nanocrystals comprises pyrolysis of organometallic reagents, such as dimethyl cadmium, injected into a hot, coordinating solvent. (Other precursors are known and can also be used.) This permits discrete nucleation and results in the controlled growth of macroscopic quantities of semiconductor nanocrystals. The injection produces a nucleus that can be grown in a controlled manner to form a semiconductor nanocrystal core. The reaction mixture can be gently heated to grow and anneal the semiconductor nanocrystal. Both the average size and the size distribution of the semiconductor nanocrystal cores in a sample are dependent on the growth temperature. The growth temperature for maintaining steady growth increases with increasing average crystal size. Resulting semiconductor nanocrystal cores are members of a population of semiconductor nanocrystals. As a result of the discrete nucleation and controlled growth, the population of semiconductor nanocrystal cores that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

According to certain embodiments for preparing semiconductor nanocrystals, the liquid medium in which the semiconductor nanocrystals are prepared includes solvents such as coordinating solvents. A coordinating solvent can help control the growth of the semiconductor nanocrystal. Alternatively, non-coordinating solvents can also be used in certain applications. A coordinating solvent is a compound having a donor lone pair that, for example, a lone electron pair available to coordinate to a surface of the growing semiconductor nanocrystal. Solvent coordination can stabilize the growing semiconductor nanocrystal. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl)phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

In certain embodiments, non-coordinating solvents can be used. Suitable non-coordinating solvents are known.

The narrow size distribution of the semiconductor nanocrystals allows the possibility of light emission in narrow spectral widths. Monodisperse semiconductor nanocrystals have been described in detail in Murray et al. (J. Am. Chem. Soc., 115:8706 (1993)). The foregoing is hereby incorporated herein by reference in their entireties.

The process of controlled growth and annealing of the semiconductor nanocrystals in the coordinating solvent that follows nucleation can also result in uniform surface derivatization and regular core structures. As the size distribution sharpens, the temperature can be raised to maintain steady growth. By adding more M donor(s) or X donor(s), the growth period can be shortened. Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the semiconductor nanocrystal cores can be further refined by size selective precipitation with a poor solvent for the semiconductor nanocrystals, such as methanol/butanol. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal population preferably has no more than a 15% rms deviation from mean diameter, more preferably 10% rms deviation or less, and most preferably 5% rms deviation or less.

Following preparation of two or more batches of semiconductor nanocrystal cores having the desired predetermined composition and maximum emission peak characteristics, the first excitonic absorption peak wavelength and the maximum emission peak wavelength for each of the batches is determined by known techniques and the difference between the first excitonic absorption peak wavelength and the maximum emission peak wavelength for each of the batches is calculated.

In order for a batch of semiconductor nanocrystal cores to be selected for overcoating, the first excitonic absorption peak and the maximum emission peak wavelength for the batch should differ by no more than 13 nm.

For additional information regarding the preparation of cores with similar properties, see for example, U.S. Patent Application Publication No. US 2002/0144644 A1 of Donald A. Zehnder, et al., for "Flow Synthesis of Quantum Dot Nanocrystals", which published on 10 Oct. 2002, at Example 4; and U.S. Patent Application Publication No. 2010/0314646 A1 of Craig Breen, et al. for "Compositions, Optical Component, System Including An Optical Component, Devices, And Other Products", which published on 16 Dec. 2010, at Example 5. Each of the foregoing published patent applications is hereby incorporated herein by reference in its entirety.

After a batch of cores is selected for overcoating as described herein, the batch of semiconductor nanocrystals core is overcoated with one or more layers of the desired overcoating material. The overcoating material can comprise one or more semiconductor materials described herein. In certain embodiments, an overcoating can comprise one or more layers of one or more different semiconductor materials.

An example of an overcoating process is described, for example, in U.S. Pat. No. 6,322,901 incorporated herein in its entirety by reference. By adjusting the temperature of the reaction mixture during overcoating and monitoring the absorption spectrum of the core, overcoated materials having high emission quantum efficiencies (EQE) and narrow size distributions can be obtained. Other overcoating processes are known and can also be used.

The narrow size distribution of the semiconductor nanocrystals allows the possibility of light emission in narrow spectral widths. Monodisperse semiconductor nanocrystals have been described in detail in Murray et al. (J. Am. Chem. Soc., 115:8706 (1993)) hereby incorporated herein by reference in its entirety.

Size distribution during the reaction process can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the semiconductor nanocrystals can be further refined by size selective precipitation with a poor solvent for the semiconductor nanocrystals, such as methanol/butanol. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal population preferably has no more than a 15% rms deviation from mean diameter, more preferably 10% rms deviation or less, and most preferably 5% rms deviation or less.

Semiconductor nanocrystals prepared in accordance with embodiments of the methods described herein can further include ligands attached thereto.

In addition to the ligand examples provided elsewhere herein, exemplary ligands also include coordinating compounds including aliphatic groups and other coordinating compounds described herein. Aliphatic ligands can promote solubility or dispersability of the semiconductor nanocrystals in certain host materials in which the core/shell nanocrystals may be included for its intended end-use application. According to one aspect, exemplary ligands include oleic acid ligands and octadecylphosphonic acid ("ODPA") ligands.

Ligands can be derived from a coordinating solvent that may be included in the reaction mixture during solution based-preparation techniques, e.g., colloidal methods. Alternatively, ligands can be added to the reaction mixture or ligands can be derived from a reagent or precursor included in the reaction mixture for synthesizing the semiconductor nanocrystals. In certain embodiments, semiconductor nanocrystals can include more than one type of ligand attached to an outer surface.

A semiconductor nanocrystal surface that includes ligands derived from the growth process or otherwise can be modified by repeated exposure to an excess of a competing ligand group (including, e.g., but not limited to, coordinating group) to exchange out the initial or native surface ligands, and/or form an overlayer. For example, a dispersion of capped semiconductor nanocrystals can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanoparticle, including, for example, but not limited to, phosphines, thiols, amines and phosphates.

For example, a semiconductor nanocrystal can be exposed to short chain polymers which exhibit an affinity for the surface and which terminate in a moiety having an affinity for a suspension or dispersion medium, such as a curable matrix material. Such affinity improves the stability of the suspension and discourages flocculation of the semiconductor nanocrystal. Examples of additional ligands include fatty acids, long chain fatty acids such as oleic acid, alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used.

Suitable coordinating ligands can be purchased commercially or prepared by ordinary synthetic organic techniques, for example, as described in J. March, Advanced Organic Chemistry, which is incorporated herein by reference in its entirety.

The emission from a semiconductor nanocrystal capable of emitting light can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both. For example, a semiconductor nanocrystal comprising CdSe can be tuned in the visible region; a semiconductor nanocrystal comprising InAs can be tuned in the infra-red region. The narrow size distribution of a population of semiconductor nanocrystals capable of emitting light can result in emission of light in a narrow spectral range. The population can be monodisperse and preferably exhibits less than a 15% rms (root-mean-square) deviation in diameter of such semiconductor nanocrystals, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such semiconductor nanocrystals that emit in the visible can be observed. IR-emitting semiconductor nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting semiconductor nanocrystal diameters decreases.

Semiconductor nanocrystals can have emission quantum efficiencies such as between 0% to greater than 95%, for example in solution, such as greater than 10%, 20%, 30%, 40%, 50%, 60%, 70%, 80%, or 90%.

Examples of inorganic semiconductor materials that can be included in a core and/or overcoating layer include, but are not limited to, Group II-VI compounds (e.g., binary, ternary, and quaternary compositions), Group III-VI compounds (e.g., binary, ternary, and quaternary compositions), Group IV-VI compounds (e.g., binary, ternary, and quaternary compositions), Group I-III-VI compounds (e.g., binary, ternary, and quaternary compositions), Group II-IV-VI compounds (e.g., binary, ternary, and quaternary compositions), and alloys including any of the foregoing, and/or a mixture including any of the foregoing. Semiconductor nanocrystals can also comprise one or more semiconductor materials that comprise ternary and quaternary alloys that include one or more of the foregoing compounds. Examples of Group II elements include Zn, Cd, and Hg. Examples of Group VI elements include oxygen, sulfur, selenium and tellurium. Examples of Group III elements include boron, aluminum, gallium, indium, and thallium. Examples of Group V elements include nitrogen, phosphorus, arsenic antimony, and bismuth. Examples of Group IV elements include silicon, germanium, tin, and lead.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of semiconductor nanocrystal core/shell structures include, without limitation: red (e.g., CdSe/CdZnS (core/shell); CdSe/ZnS/CdZnS (core/shell/shell), etc.) green (e.g., CdZnSe/CdZnS (core/shell), CdSe/ZnS/CdZnS (core/shell/shell), etc.), and blue (e.g., CdS/CdZnS (core/shell).

Semiconductor nanocrystals can have various shapes, including, but not limited to, sphere, rod, disk, other shapes, and mixtures of various shaped particles.

In certain preferred embodiments of the various aspects of the inventions described herein, the semiconductor nanocrystal is undoped.

As used herein, "undoped semiconductor nanocrystal" refers to a semiconductor nanocrystal that emits light due to quantum confinement and without emission from an activator species.

Semiconductor nanocrystals produced according to the present invention may be used in various applications. According to one aspect, semiconductor nanocrystals produced according to the methods described herein may be used in photoluminescent (PL) applications where semiconductor nanocrystal materials are excited optically and the optical excitation is downconverted via emission from the semiconductor nanocrystals. According to this aspect, exemplary applications include devices or systems where an LED light source is used, for example solid-state lighting, LED Backlights (LED-BLU) Liquid Crystal Displays (LCD) and the like. According to an additional aspect, semiconductor nanocrystals produced according to the methods described herein may be used in a device or system where a light source is downconverted to other wavelengths (e.g. solar concentrators or downconverters where sunlight is converted to specific wavelengths tuned to highest efficiency window of the solar cells used in the system. Additional applications include plasma based systems where high energy plasma emission can excite a semiconductor nanocrystal downconverter, taggants, bio-labeling or imaging application, and barcoding or security/covert labeling applications. According to an additional aspect, semiconductor nanocrystals produced according to the present invention may be used in electroluminescent (EL) applications where semiconductor nanocrystals are excited electrically and the excitation results in emission from the semiconductor nanocrystals. According to this aspect, exemplary applications include direct charge injection into the semiconductor nanocrystals generating semiconductor nanocrystal excited states and subsequent semiconductor nanocrystal emission, energy transfer from other semiconductor materials within the device to the semiconductor nanocrystals, generating an excited state and subsequent semiconductor nanocrystal emission and the like. According to an additional aspect, semiconductor nanocrystals produced according to the present invention may be used in photovoltaic (PV) applications where the semiconductor nanocrystal materials are excited optically and the excitation results in current generation and/or a voltage due to carrier extraction from the semiconductor nanocrystals.

Additional information that may be useful in connection with the present disclosure and the inventions described herein is included in International Application No. PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods"; International Application No. PCT/US2010/32859 of Modi et al, filed 28 Apr. 2010 entitled "Optical Materials, Optical Components, And Methods"; International Application No. PCT/US2010/032799 of Modi et al, filed 28 Apr. 2010 entitled "Optical Materials, Optical Components, Devices, And Methods"; International Application No. PCT/US2011/047284 of Sadasivan et al, filed 10 Aug. 2011 entitled ""Semiconductor Nanocrystal Based Lighting"; U.S. patent application Ser. No. 12/283,609 of Coe-Sullivan et al, filed 12 Sep. 2008 entitled "Compositions, Optical Component, System Including An Optical Component, Devices, And Other Products"; International Application No. PCT/US2008/10651 of Breen et al, filed 12 Sep. 2008 entitled "Functionalized Nanoparticles And Method"; International Application No. PCT/US2007/024320 of Clough et al, filed 21 Nov. 2007, entitled "Nanocrystals Including A Group IIIa Element And A Group Va Element, Method, Composition, Device And Other Products"; and U.S. Application No. 61/486,748 filed May 16, 2011 entitled "Method for Preparing Semiconductor Nanocrystals", each of the foregoing being hereby incorporated herein by reference in its entirety.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for preparing semiconductor nanocrystals including a core and an overcoating layer, the method comprising:
    preparing more than one batch of cores comprising a first semiconductor material and having a maximum emission peak within a predetermined spectral region, wherein each batch of cores is characterized by a first excitonic absorption peak at an absorption wavelength and a maximum emission peak at an emission wavelength;
    selecting a batch of cores from the batches prepared wherein the selected batch is characterized by a difference between the absorption wavelength and the emission wavelength that is less than or equal to 13; and
    overcoating the cores of the selected batch with a layer comprising a second semiconductor material.

2. A method in accordance with claim 1 wherein the selected batch of cores is further characterized by a maximum peak having a full-width at half-maximum no greater than 30 nm.

3. A method in accordance with claim 1 wherein the first semiconductor material comprises a Group II-VI semiconductor.

4. A method in accordance with claim 3 wherein the first semiconductor material comprises cadmium selenide.

5. A method in accordance with claim 1 wherein the overcoated cores include a ligand comprising a phosphonic acid-based compound.

6. A method in accordance with claim 5 wherein the overcoated cores further include an amine-based ligand.

7. A method in accordance with claim 1 wherein the overcoated cores further include an amine-based ligand.

8. A method in accordance with claim 1 wherein the second semiconductor material comprises a Group II-VI semiconductor compound.

9. A method in accordance with claim 8 wherein the Group II-VI semiconductor compound comprises a ternary compound.

10. A method in accordance with claim 9 wherein the ternary compound comprises CdZnS.

11. A method for preparing semiconductor nanomystals including a core and an overcoating layer comprising the steps of:
  (a) preparing more than one batch of cores comprising a first semiconductor material and having a maximum emission peak within a predetermined spectral region, wherein each batch of cores is characterized by a first excitonic absorption peak at an absorption wavelength and a maximum emission peak at an emission wavelength
  (b) analyzing the batches of cores prepared in step (a) to determine the difference between the absorption wavelength and the emission wavelength for each batch;
  (c) selecting one or more batches of cores from step (b) wherein the difference is less than or equal to 13 nm; and
  (d) overcoating the selected batch or batches of cores from step (c) with a layer comprising a second semiconductor material to a predetermined thickness.

12. A method in accordance with claim 11 wherein the selected batches are combined for overcoating.

13. A method in accordance with claim 11 wherein the emission wavelength for each of the combined batches differs from that of any combined batch by no more than 5 nm.

14. A method in accordance with claim 11 wherein the selected batch of cores is further characterized by a maximum peak having a full-width at half-maximum no greater than 30 nm.

15. A method in accordance with claim 11 wherein the first semiconductor material comprises a Group II-VI semiconductor.

16. A method in accordance with claim 11 wherein the overcoated cores include a ligand comprising a phosphonic acid-based compound.

17. A method in accordance with claim 16 wherein the overcoated cores further include an amine-based ligand.

18. A method in accordance with claim 11 wherein the overcoated cores further include an amine-based ligand.

19. A method in accordance with claim 11 wherein the second semiconductor material comprises a Group II-VI semiconductor compound.

20. A method in accordance with claim 19 wherein the Group II-VI semiconductor compound comprises a ternary compound.

* * * * *